United States Patent
Nishiyama

(10) Patent No.: US 8,890,129 B2
(45) Date of Patent: Nov. 18, 2014

(54) LIGHT EMITTING DEVICE, LIGHT EMITTING APPARATUS PROVIDED WITH A LIGHT EMITTING DEVICE, AND METHOD OF MANUFACTURING A LIGHT EMITTING DEVICE

(71) Applicant: Panasonic Corporation, Osaka (JP)

(72) Inventor: Seiji Nishiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/746,481

(22) Filed: Jan. 22, 2013

(65) Prior Publication Data

US 2013/0126851 A1    May 23, 2013

Related U.S. Application Data

(63) Continuation of application No. PCT/JP2010/004986, filed on Aug. 6, 2010.

(51) Int. Cl.
*H01L 51/52* (2006.01)
*H01L 33/42* (2010.01)

(52) U.S. Cl.
CPC ........ *H01L 51/5203* (2013.01); *H01L 51/5215* (2013.01); *H01L 33/42* (2013.01); *H01L 2251/5323* (2013.01); *H01L 2251/5369* (2013.01)
USPC .............................................. 257/40; 438/99

(58) Field of Classification Search
CPC ............ H01L 51/0036; H01L 51/0545; H01L 51/5088
USPC .............................................. 257/40; 438/22
See application file for complete search history.

(56) References Cited

U.S. PATENT DOCUMENTS

| 5,294,869 A | 3/1994 | Tang et al. |
| 5,443,922 A | 8/1995 | Nishizaki et al. |

(Continued)

FOREIGN PATENT DOCUMENTS

| DE | 102005007540 | 8/2006 |
| EP | 2175504 | 4/2010 |

(Continued)

OTHER PUBLICATIONS

Meyer et al., Charge generation layers comprising transition metal-oxide/organic interfaces: Electronic structure and charge generation mechanism, May 10, 2010, Applied Physics Lettters, 96, pp. 1-3.*

(Continued)

*Primary Examiner* — Matthew W Such
*Assistant Examiner* — Warren H Kilpatrick
(74) *Attorney, Agent, or Firm* — Greenblum & Bernstein, P.L.C.

(57) ABSTRACT

The present disclosure aims to provide a light-emitter having a favorable luminescence property, a light-emitting device having the light-emitter, and a method of manufacturing the light-emitter. Specifically, the light-emitter has the following structure. A hole injection layer and a light-emitting layer are layered between a first electrode and a second electrode which are transparent, and a light-emitting layer exists in an area defined by a bank. Thus, organic EL elements are formed. The hole injection layer has a recess in an upper surface of the area defined by the bank. An upper peripheral edge of the recess in the hole-injection layer is covered with a portion of the bank.

23 Claims, 13 Drawing Sheets

(56) References Cited

U.S. PATENT DOCUMENTS

| | | | |
|---|---|---|---|
| 5,688,551 | A | 11/1997 | Littman et al. |
| 6,132,280 | A | 10/2000 | Tanabe et al. |
| 6,284,393 | B1 | 9/2001 | Hosokawa et al. |
| 6,309,801 | B1 | 10/2001 | Meijer et al. |
| 2002/0051894 | A1 | 5/2002 | Yoshikawa |
| 2002/0158835 | A1 | 10/2002 | Kobayashi et al. |
| 2003/0137242 | A1 | 7/2003 | Seki |
| 2004/0075385 | A1* | 4/2004 | Tao ............................ 313/506 |
| 2004/0178414 | A1 | 9/2004 | Frey et al. |
| 2005/0064633 | A1 | 3/2005 | Mikoshiba |
| 2005/0093432 | A1 | 5/2005 | Yamazaki et al. |
| 2005/0093434 | A1* | 5/2005 | Suh et al. .................... 313/504 |
| 2005/0170208 | A1 | 8/2005 | Yatsunami et al. |
| 2005/0208206 | A1 | 9/2005 | Yoshikawa |
| 2005/0266763 | A1* | 12/2005 | Kimura et al. ................ 445/24 |
| 2006/0008931 | A1 | 1/2006 | Lee et al. |
| 2006/0139342 | A1 | 6/2006 | Yu |
| 2006/0204788 | A1 | 9/2006 | Yoshikawa |
| 2006/0243377 | A1 | 11/2006 | Matsuo et al. |
| 2006/0284166 | A1 | 12/2006 | Chua et al. |
| 2007/0029929 | A1 | 2/2007 | Nakamura et al. |
| 2007/0099396 | A1 | 5/2007 | Hirai et al. |
| 2007/0172978 | A1 | 7/2007 | Chua et al. |
| 2007/0241665 | A1 | 10/2007 | Sakanoue et al. |
| 2007/0290604 | A1 | 12/2007 | Sakanoue et al. |
| 2008/0150422 | A1 | 6/2008 | Ohara |
| 2008/0231179 | A1 | 9/2008 | Abe et al. |
| 2008/0312437 | A1 | 12/2008 | Inoue et al. |
| 2009/0058268 | A1 | 3/2009 | Yoshida et al. |
| 2009/0096364 | A1 | 4/2009 | Fujii et al. |
| 2009/0115318 | A1* | 5/2009 | Gregory et al. ............... 313/504 |
| 2009/0160325 | A1 | 6/2009 | Yatsunami et al. |
| 2009/0200917 | A1 | 8/2009 | Yamagata et al. |
| 2009/0206422 | A1 | 8/2009 | Illing et al. |
| 2009/0224664 | A1 | 9/2009 | Yoshida et al. |
| 2009/0243478 | A1 | 10/2009 | Shoda et al. |
| 2009/0250685 | A1 | 10/2009 | Moon |
| 2009/0272999 | A1 | 11/2009 | Yoshida et al. |
| 2009/0284135 | A1 | 11/2009 | Yoshida et al. |
| 2009/0284141 | A1 | 11/2009 | Sakanoue et al. |
| 2009/0284144 | A1 | 11/2009 | Fujioka et al. |
| 2009/0284146 | A1 | 11/2009 | Yoshida et al. |
| 2009/0315027 | A1 | 12/2009 | Kidu et al. |
| 2010/0084672 | A1 | 4/2010 | Ueno et al. |
| 2010/0102310 | A1 | 4/2010 | Komatsu et al. |
| 2010/0181554 | A1 | 7/2010 | Yoshida et al. |
| 2010/0181559 | A1 | 7/2010 | Nakatani et al. |
| 2010/0188376 | A1 | 7/2010 | Sagawa et al. |
| 2010/0213827 | A1 | 8/2010 | Yoshida et al. |
| 2010/0252857 | A1 | 10/2010 | Nakatani et al. |
| 2010/0258833 | A1 | 10/2010 | Okumoto et al. |
| 2010/0302221 | A1 | 12/2010 | Okumoto |
| 2011/0018007 | A1 | 1/2011 | Kasahara et al. |
| 2011/0037065 | A1 | 2/2011 | Ueno et al. |
| 2011/0037068 | A1 | 2/2011 | Yamazaki et al. |
| 2011/0042703 | A1 | 2/2011 | Okumoto et al. |
| 2011/0140091 | A1 | 6/2011 | Friend et al. |
| 2011/0140596 | A1 | 6/2011 | Yoshida et al. |
| 2011/0180821 | A1 | 7/2011 | Matsushima |
| 2011/0193107 | A1 | 8/2011 | Takeuchi et al. |
| 2011/0198623 | A1 | 8/2011 | Matsushima |
| 2011/0198624 | A1 | 8/2011 | Matsushima |
| 2011/0204410 | A1 | 8/2011 | Yada |
| 2012/0061656 | A1 | 3/2012 | Ohuchi et al. |
| 2012/0178191 | A1 | 7/2012 | Sakanoue et al. |

FOREIGN PATENT DOCUMENTS

| | | |
|---|---|---|
| EP | 2270896 | 1/2011 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-220656 | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-218250 | 9/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-009746 | 1/2010 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2007/037358 | 4/2007 |
| WO | 2008/120714 A1 | 10/2008 |
| WO | 2008/149498 A1 | 12/2008 |
| WO | 2008/149499 A1 | 12/2008 |
| WO | 2009/107323 | 9/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

(56) References Cited

FOREIGN PATENT DOCUMENTS

OTHER PUBLICATIONS

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
U.S. Appl. No. 13/205,773 to Seiji Nishiyama, filed Aug. 9, 2011.
U.S. Appl. No. 13/739,363 to Seiji Nishiyama et al., filed Jan. 11, 2013.
U.S. Appl. No. 13/736,285 to Seiji Nishiyama et al., filed Jan. 8, 2013.
U.S. Appl. No. 13/740,348 to Seiji Nishiyama et al., filed Jan. 14, 2013.
U.S. Appl. No. 13/740,353 to Seiji Nishiyama, filed Jan. 14, 2013.
U.S. Appl. No. 13/739,290 to Seiji Nishiyama, filed Jan. 11, 2013.
U.S. Appl. No. 13/719,556 to Takayuki Takeuchi et al., filed Dec. 19, 2012.
U.S. Appl. No. 13/721,202 to Kenji Harada et al., filed Dec. 20, 2012.
International Search Report in PCT/JP2010/000782, dated Apr. 6, 2010.
International Search Report in PCT/JP2010/004987, dated Sep. 7, 2010.
International Search Report in PCT/JP2010/004959, dated Nov. 9, 2010.
International Search Report in PCT/JP2010/004985, dated Nov. 16, 2010.
International Search Report in PCT/JP2010/004962, dated Sep. 7, 2010.
International Search Report in PCT/JP2010/004955, dated Sep. 7, 2010.
International Search Report in PCT/JP2010/004986, dated Aug. 31, 2010.
International Search Report in PCT/JP2010/004957, dated Aug. 31, 2010.
International Search Report in PCT/JP2010/004956, dated Sep. 7, 2010.
United States Office Action in U.S. Appl. No. 13/205,773, dated Aug. 16, 2013.
United States Office Action in U.S. Appl. No. 13/205,773, dated Jan. 10, 2013.
Extended European Search Report (EESR) in European Patent Application No. 10741076.3, dated Feb. 25, 2013.
United States Advisory Action in U.S. Appl. No. 13/205,773, dated Jan. 15, 2014.
United States Office Action in U.S. Appl. No. 13/205,773, dated Feb. 28, 2014.
Tungsten Oxide, McGraw-Hill Dictionary of Scientific and Technical Terms, McGraw-Hill Book Company, Fourth Edition, p. 1979, left column, date stamped Feb. 28, 1989.
United States Office Action in U.S. Appl. No. 13/205,773, dated Mar. 6, 2013.
United States Office Action in U.S. Appl. No. 13/740,348, dated Apr. 29, 2014.
Ramana et al., "Electron microscopy investigation of structural transformations in tungsten oxide ($WO_3$) thin films", Physica Status Solidi (a) 202, No. 10, pp. R108-R110 (Jul. 6, 2005).
Horsley et al., "Structure of Surface Tungsten Oxide Species in the $WO_3/AL_2O_3$ Supported Oxide System from X-Ray Absorption Near-edge Spectroscopy and Raman Spectroscopy", Journal of Physical Chemistry, 91, pp. 4014-4020 (1987).
United States Office Action in U.S. Appl. No. 13/205,773, dated Jul. 17, 2014.
United States Office Action in U.S. Appl. No. 13/739,363, dated Aug. 1, 2014.
China Office Action from State Intellectual Property Office (SIPO) in Chinese Patent Application No. 201080004030.X, dated Aug. 26, 2013, together with a partial English language translation.
United States Office Action in U.S. Appl. No. 13/719,556, dated Apr. 11, 2014.

\* cited by examiner

LIGHT EMITTING DEVICE, LIGHT EMITTING APPARATUS PROVIDED WITH A LIGHT EMITTING DEVICE, AND METHOD OF MANUFACTURING A LIGHT EMITTING DEVICE

CROSS REFERENCE TO RELATED APPLICATIONS

This is a continuation application of PCT Application No. PCT/JP2010/004986 filed Aug. 6, 2010, designating the United States of America, the disclosure of which, including the specification, drawings and claims, is incorporated herein by reference in its entirety.

TECHNICAL FIELD

The present disclosure relates to a light-emitter, a light-emitting device having the same, and a method of manufacturing the light-emitter.

DESCRIPTION OF THE RELATED ART

In recent years, progress has been made in research and development of an organic electroluminescence element (hereinafter, referred to as an "organic EL element"). The organic EL element is a light-emitter that uses the phenomenon of electroluminescence occurring in organic material. The organic EL element has a structure in which a light-emitting layer is interposed between a first electrode (anode) and a second electrode (cathode). A bank made from an insulating material is formed laterally along the light-emitting layer, and defines a shape of the light-emitting layer. Between the first electrode and the light-emitting layer, a hole injection layer, a hole transport layer, or a hole injection transport layer, for example, is interposed, as necessary. Between the second electrode and the light-emitting layer, an electron injection layer, an electron transport layer, or an electron injection transport layer is interposed, as necessary. Hereinafter, the hole injection layer, the hole transport layer, the hole injection transport layer, the electron injection layer, the electron transport layer, and the electron injection transport layer are collectively referred to as a "charge injection transport layer".

Although the charge injection transport layer of a conventional organic EL element is formed using a conductive polymer material such as PEDOT (a mixture of polythiophene and polystyrene sulfonate), use of the charge injection transport layer formed using a metal compound such as a transition metal oxide has been proposed (see Patent Literature 1, for example). The metal compound has a better voltage-current density property than the PEDOT, and is considered to be less likely to deteriorate when high current is applied to increase luminescence intensity. Therefore, the metal compound is expected to be used for the charge injection transport layer.

CITATION LIST

Patent Literature

[Patent Literature 1] Japanese Patent Application Publication No. 2005-203339

[Patent Literature 2] Japanese Patent Application Publication No. 10-162959

SUMMARY

Here, it is also necessary to improve a luminescence property of an organic EL element having the above-mentioned structure in which the metal compound is applied to the charge injection transport.

One non-limiting and exemplary embodiment provides a light-emitter having a favorable luminescence property, a light-emitting device having the light-emitter, and a method of manufacturing the light-emitter.

In one general aspect, the techniques disclosed here feature a double-sided light-emitter that emits light from both sides thereof, comprising: a first electrode; a laminate disposed on the first electrode that includes a charge injection transport layer and a functional layer including a light-emitting layer; a second electrode disposed on the laminate; and a bank that is insulative and defines an area in which the light-emitting layer is to be formed, wherein the first electrode and the second electrode are transparent electrodes, the charge injection transport layer has a recess in an upper surface of the area defined by the bank, an upper peripheral edge of the recess is covered with a portion of the bank, a part of the light-emitting layer is interposed between the second electrode and the upper peripheral edge of the recess, the part of the light-emitting layer is interposed between the second electrode and the portion of the bank, and undergoes charge injection from the second electrode, and the portion of the bank is interposed between the upper peripheral edge of the recess and the part of the light-emitting layer.

With the above-mentioned structure, since the upper peripheral edge of the recess formed in the charge injection transport layer is covered with the portion of the bank, the electrical field concentration in the vicinity of the upper peripheral edge of the recess is suppressed when the light-emitter emits light. As a result, localized flow of current is suppressed in the light-emitting layer. Therefore, an occurrence of uneven luminance in a light-emitting surface is suppressed, and the luminescence property is further improved.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

DETAILED DESCRIPTION

<Background Leading to the Invention>

Regarding the organic EL element to which the metal compound is applied as described in the section of Background Art, the inventor found, through an intense study, that the uneven luminance can occur in the light-emitting surface and a life of the organic EL element can be reduced due to localized deterioration of the light-emitting layer.

After further studying these problems, the inventor gained the following knowledge.

Figure 1A:
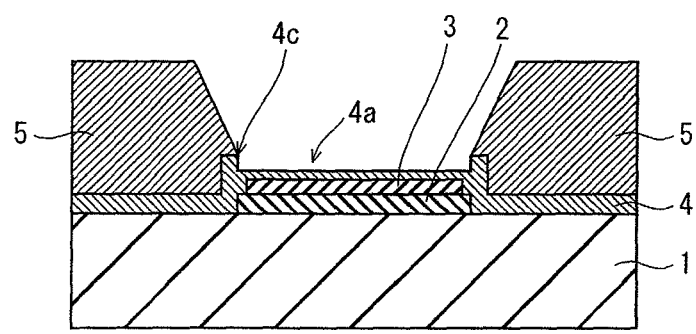
FIGS. 1A and 1B each show an end elevation to illustrate the background leading to the present disclosure.
Figure 1B:
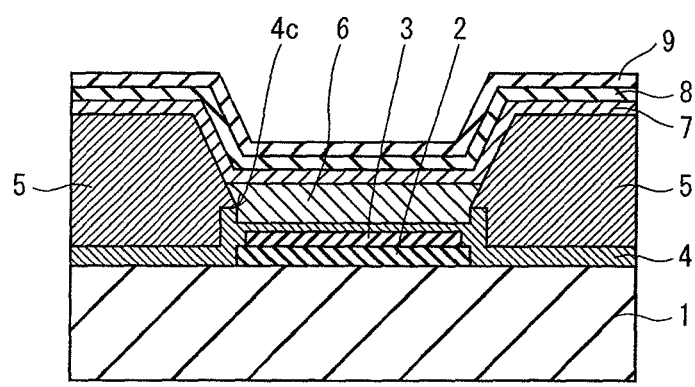

FIGS. 1A and 1B are each an end elevation showing a manufacturing process of an organic EL display. FIG. 1A shows a status in which a first electrode 2, an ITO layer 3, a hole injection layer 4, and a bank 5 are formed on a TFT substrate 1. FIG. 1B shows a status in which a light-emitting layer 6, an electron injection layer 7, a second electrode 8, and a passivation layer 9 are formed in addition to the components shown in FIG. 1A.

With the structure in which the metal compound is applied to the charge injection transport layer (the hole injection layer 4 in this example), a recess 4a is formed in an upper surface of the hole injection layer 4 (see FIG. 1A) in a process of forming the bank 5. If the light-emitting layer 6 is formed with the recess 4a formed in the upper surface of the hole injection layer 4 (see FIG. 1B), an electric field concentrates in the vicinity of an upper peripheral edge 4c of the recess 4a when the organic EL display emits light. As a result, localized flow of current can occur in the light-emitting layer 6. This might lead to the occurrence of uneven luminance in a light-emitting surface and reduce a life of the organic EL element due to localized deterioration of the light-emitting layer.

The above-described problems and knowledge are unique to an organic EL element to which a metal compound is applied, and have technical significance in terms of not having been revealed.

As described above, the inventor arrived at the following technical features through a series of research and studies. That is, by covering the upper peripheral edge of the recess formed in the upper surface of the charge injection transport layer with a portion of the bank, concentration of charges in the vicinity of the upper peripheral edge of the recess is suppressed when an organic EL element emits light. As a result, localized flow of current is suppressed.

<Overview of Aspects of the Present Invention>

In one general aspect, the techniques disclosed here feature a double-sided light-emitter that emits light from both sides thereof, comprising: a first electrode; a laminate disposed on the first electrode that includes a charge injection transport layer and a functional layer including a light-emitting layer; a second electrode disposed on the laminate; and a bank that is insulative and defines an area in which the light-emitting layer is to be formed, wherein the first electrode and the second electrode are transparent electrodes, the charge injection transport layer has a recess in an upper surface of the area defined by the bank, an upper peripheral edge of the recess is covered with a portion of the bank, a part of the light-emitting layer is interposed between the second electrode and the upper peripheral edge of the recess, the part of the light-emitting layer is interposed between the second electrode and the portion of the bank, and undergoes charge injection from the second electrode, and the portion of the bank is interposed between the upper peripheral edge of the recess and the part of the light-emitting layer.

With the above-mentioned structure, since the upper peripheral edge of the recess formed in the charge injection transport layer is covered with the portion of the bank, the electrical field concentration in the vicinity of the upper peripheral edge of the recess is suppressed when the light-emitter emits light. As a result, localized flow of current is suppressed in the light-emitting layer. Therefore, an occurrence of uneven luminance in a light-emitting surface is suppressed, and the luminescence property is further improved.

The charge injection transport layer may be a hole injection layer made from one of a metal oxide, a metal nitride, and a metal oxynitride. In general, these are hydrophilic materials. Therefore, the recess is formed in a washing process with pure water in the process of forming the bank.

The functional layer may include a hole transport layer that transports holes from the hole injection layer to the light-emitting layer, and the hole transport layer may be interposed between the hole injection layer and the light-emitting layer.

The transparent electrodes may be made from ITO or IZO.

A metal thin film that is semi-transparent or transparent may be layered on either or both the first electrode and the second electrode.

The metal thin film may contain any material selected from the group consisting of Ag, Mg, Al, Pt, Pd, Au, Ni, Ir and Cr, and has a thickness falling within a range of 3 nm to 30 nm.

The charge injection transport layer may be made from a material that is eroded when exposed to a liquid used for forming the bank.

The liquid may be water or a TMAH solution. With this structure, the recess is formed in a process of forming a bank without adding extra steps.

The portion of the bank may reach a bottom of the recess, and a side surface of the bank may slope upward from the bottom of the recess to a top of the bank. With this structure, when the light-emitting layer is formed using printing technology such as inkjet technology, ink is distributed to every corner of an area defined by the bank. As a result, formation of a void and the like is suppressed.

The portion of the bank may be out of contact with a bottom of the recess. In order to cover the upper peripheral edge of the recess with the portion of the bank, there is a method, for example, of heat-treating a bank material to make it fluid so that the upper peripheral edge of the recess is covered with a portion of the bank material. With the above-mentioned structure, the temperature and time of the heat treatment are reduced as it is not necessary to extend the bank material to the bottom of the recess.

The bank may include an insulating material. With this structure, adjacent light-emitting layers are insulated from each other.

The light-emitting layer may comprise an organic EL layer.

The charge injection transport layer may extend laterally along a bottom surface of the bank.

The upper peripheral edge of the recess may comprise a convex portion composed of (i) a part of the upper surface of the charge injection transport layer in which the recess is not formed, and (ii) an inner side surface of the recess.

Another aspect provides a light-emitting device comprising a plurality of light-emitters that are each the light-emitter stated above.

Yet another aspect provides a method of manufacturing a double-sided light-emitter emitting light from both sides thereof and including a first electrode, a laminate disposed on the first electrode that includes a charge injection transport layer and a functional layer including a light-emitting layer, a second electrode disposed on the laminate, and a bank that defines an area in which the light-emitting layer is to be formed, the method comprising: forming the first electrode from a transparent electrode; forming the charge injection transport layer; forming a bank material layer that forms the bank on the charge injection transport layer; removing a portion of the bank material layer to partially expose the charge injection transport layer; heat-treating a remaining portion of the bank material layer; forming the functional layer on an exposed surface of the charge injection transport layer after the heat treatment; and forming the second electrode from a transparent electrode, wherein the charge injection transport layer is made from a material that is eroded when exposed to a liquid used while the charge injection transport layer is partially exposed, the charge injection transport layer having a recess in the exposed surface thereof so that a bottom of the recess is lower than a bottom surface of a remaining portion of the bank material layer, the recess being formed by the exposed surface eroded by the liquid, the remaining portion of the bank material layer being made fluid so that the bank material layer extends to cover an upper peripheral edge of the recess.

The charge injection transport layer may be a hole injection layer made from one of a metal oxide, a metal nitride, and a metal oxynitride.

The functional layer may include a hole transport layer that transports holes from the hole injection layer to the light-emitting layer, and the hole transport layer may be interposed between the hole injection layer and the light-emitting layer.

The transparent electrodes may be made from ITO or IZO.

A metal thin film that is semi-transparent or transparent may be layered on either or both the first electrode and the second electrode.

The metal thin film may contain any material selected from the group consisting of Ag, Mg, Al, Pt, Pd, Au, Ni, Ir and Cr, and has a thickness falling within a range of 3 nm to 30 nm.

The metal thin film may be formed by vacuum forming.

The following describes embodiment of the present disclosure in detail, with reference to the drawings. Here, an organic EL element using an organic EL material as a light-emitting layer is taken as an example of the light-emitter, and an organic EL display is taken as an example of the light-emitting device having a plurality of light-emitters. Note that the drawings are not to scale, so that proportions of members in the drawings are different from actual proportions.

<Configuration>

Figure 2:
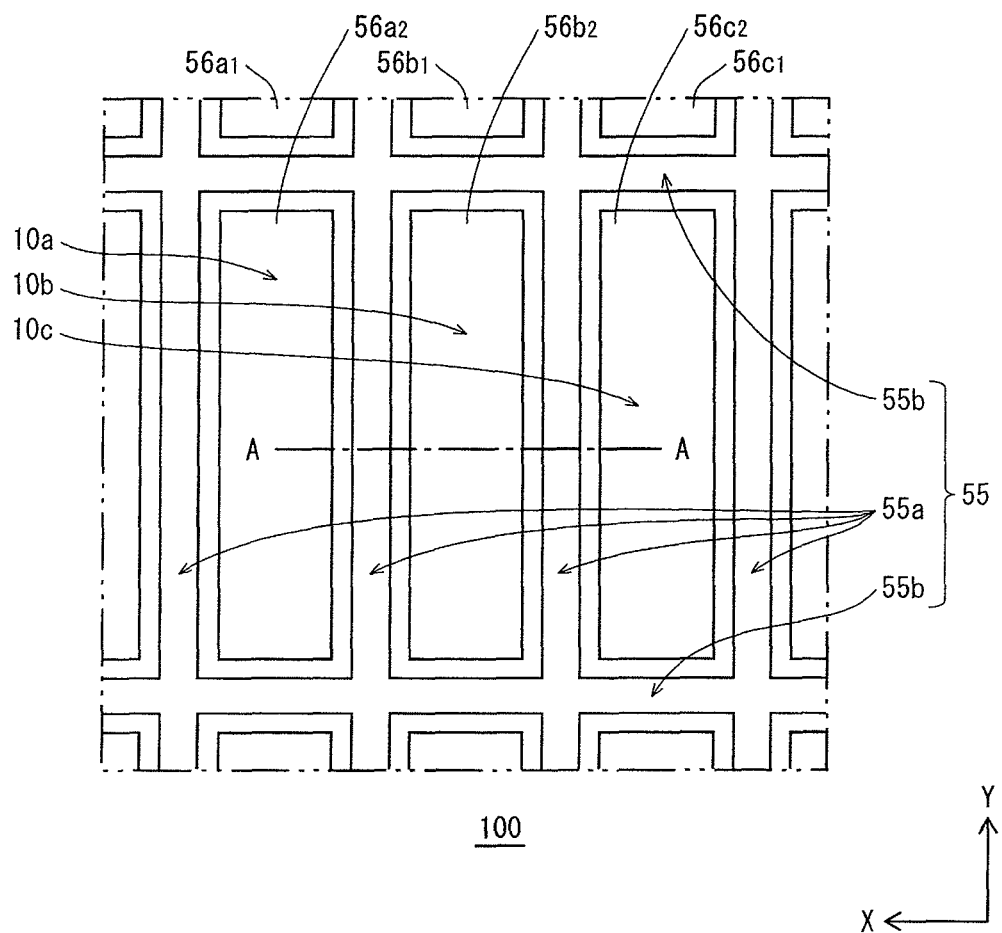
FIG. 2 is a plan view showing a part of an organic EL display pertaining to an embodiment of the present disclosure.

FIG. 2 is a plan view showing a part of a double-sided organic EL display pertaining to an embodiment of the present disclosure.

An organic EL display 100 is a double-sided organic EL display composed of organic EL elements 10a, 10b, and 10c arranged in a matrix and each provided with a light emitting layer having a color of either red (R), green (G), or blue (B). Each organic EL element functions as a sub-pixel, and three consecutive organic EL elements of colors of RGB function as a pixel as a whole. Each organic EL element functions as a sub-pixel, and three consecutive organic EL elements of colors of RGB function as a pixel as a whole.

In an example of FIG. 2, a pixel bank 55 having a lattice shape is adopted. Each bank element 55a extending along a Y axis delimits consecutive light-emitting layers 56a1, 56b1, and 56c1 arranged along an X axis as well as consecutive light-emitting layers 56a2, 56b2, and 56c2 arranged along the X axis.

On the other hand, a bank element 55b extending along the X axis delimits adjacent light-emitting layers 56a1 and 56a2 arranged along the Y axis, adjacent light-emitting layers 56b1 and 56b2 arranged along the Y axis, and adjacent light-emitting layers 56c1 and 56c2 arranged along the Y axis.

Figure 3:
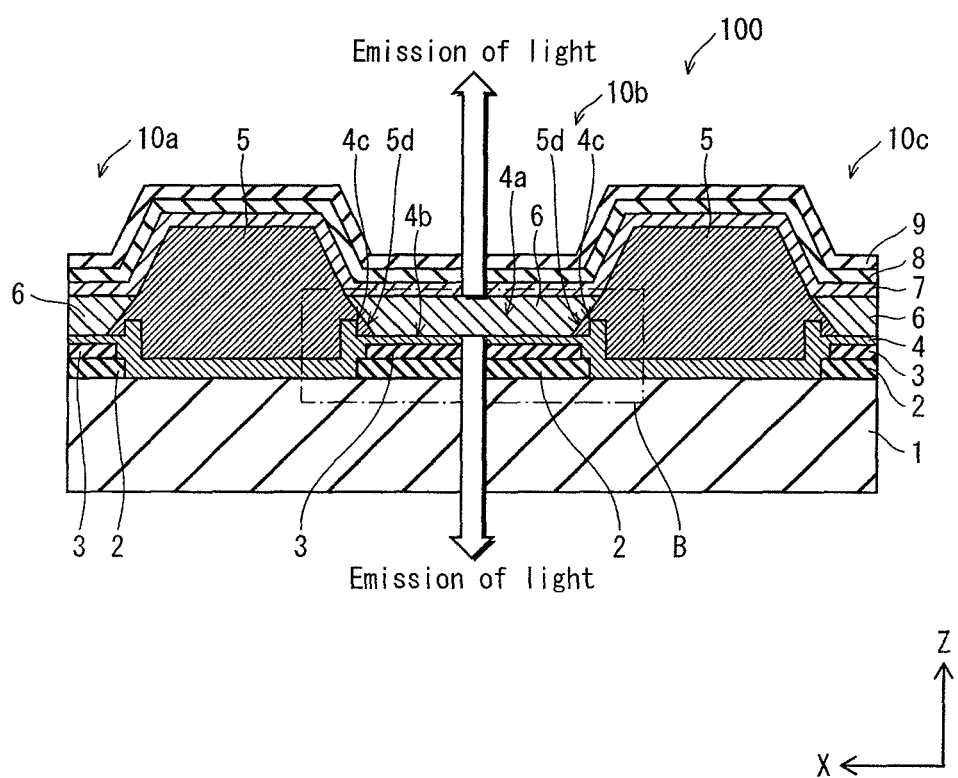
FIG. 3 is an end elevation schematically showing a cross section of the part of the organic EL display pertaining to an embodiment of the present disclosure.
Figure 4:
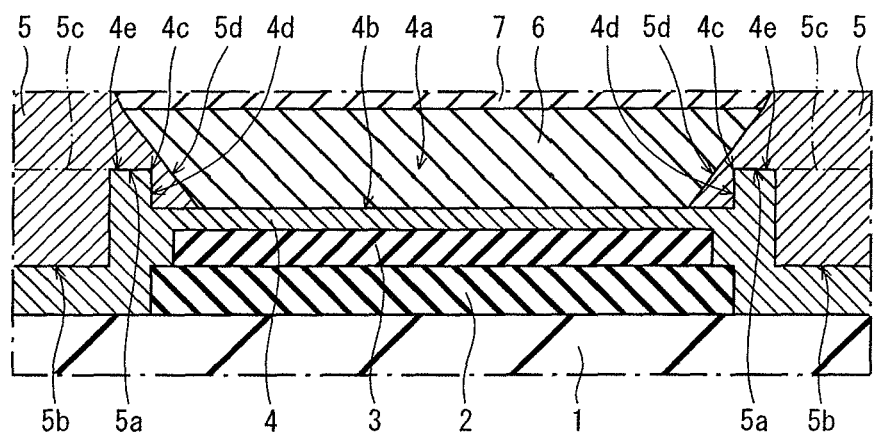
FIG. 4 is an enlarged end elevation of a portion B enclosed by an alternate long and short dash line of FIG. 3.

FIG. 3 is an end elevation schematically showing a cross section of a part of the organic EL display pertaining to an embodiment of the present disclosure taken along the line A-A of FIG. 2. FIG. 4 is an enlarged end elevation of a portion B enclosed by an alternate long and short dash line of FIG. 3.

On the TFT substrate 1 (hereinafter, simply referred to as a "substrate 1"), the first electrodes (anodes) 2 are formed in a matrix. On the first electrode 2, the ITO (indium tin oxide) layer 3 and the hole injection layer 4 are laminated in the stated order. Note that, while the ITO layer 3 is laminated only on the first electrode 2, the hole injection layer 4 is formed not only on the first electrode 2 but also over the substrate 1.

The bank 5 is formed above a periphery of the first electrode 2 via the hole injection layer 4. The light-emitting layer 6 is laminated in an area defined by the bank 5. On the light-emitting layer 6, the electron injection layer 7, the second electrode (cathode) 8, and the passivation layer 9 are formed continuously across the consecutive organic EL elements 10a, 10b and 10c, passing over the bank 5. When driven, the organic EL element produces light from both sides, namely the side closer to the first electrode 2 and the side closer to the second electrode 8.

<Structure of Each Component>

The following specifically explains each component. It should be noted here that each component should be transparent so that the organic EL display will be a double-sided display.

The substrate 1 is made from an insulating material such as alkali-free glass, soda glass, nonluminescent glass, phosphate glass, boric-acid glass, quartz, acrylic resin, styrene resin, polycarbonate resin, epoxy resin, polyethylene, polyester, silicon resin, and alumina.

The first electrode 2 is a transparent electrode, and is made of metal oxide such as ITO and IZO, or APC (alloy of silver, palladium and copper), ARA (alloy of silver, rubidium and gold), MoCr (alloy of molybdenum and chrome) or NiCr (alloy of nickel and chrome), for example. Alternatively, the first electrode 2 may be a metal film containing any material selected from the group consisting of Ag, Mg, Al, Pt, Pd, Au, Ni, Ir and Cr. In any of the cases, the first electrode 2 is formed to be thick to some extent (e.g. film thickness of 3 nm to 30 nm) so as to have sufficient transparency. Although the first electrode 2, and the second electrode 8 which will be described later, are both transparent electrodes, it should be noted here that they can be referred to as "semi-transparent or transparent" thin film, because they have a certain degree of transparency. Even in the case of a film made of metal material generally known as opaque material, the film can be semi-transparent or transparent and have the certain degree of transparency when processed to be thin as described above.

Figure 12:
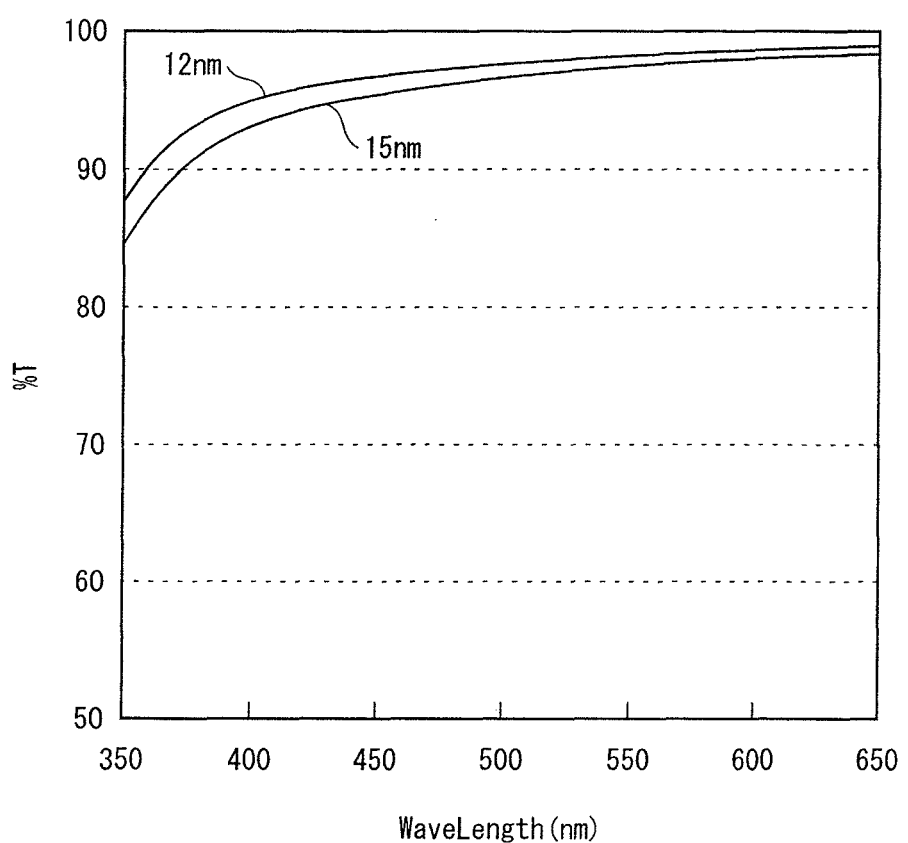
FIG. 12 is a graph showing a relationship between a wavelength and a degree of transparency of a transparent electrode.

FIG. 12 is a graph showing the relationship between the degree of transparency (T %) and the wavelength with respect to tungsten oxide (WOO having a thickness of 12 nm or 15 nm. As shown in this figure, in the case of tungsten oxide, the degree of transparency will be equal to or greater than 85% with respect to a wide wavelength range covering 350 nm to 650 nm when the thick ness is set to fall within the range of 12 nm to 15 nm. Besides, academic paper (V. Bulovic, G. Gu, P. E. Burrows, S. R. Forrest, Nature vol. 380, 29 (1996)) discusses about a double-sided OELD using Mg—Ag alloy electrodes having a film thickness falling within the range of 5 to 40 nm. Furthermore, Patent Literature 2 shows that a desirable transparency can be achieved by setting the thickness of the cathode to fall within the range of 10 to 800 nm. In view of the findings above, it can be concluded that a sufficient transparency can be achieved with the first electrode 2 and the second electrode 8 when the thickness of the metal material thereof is set to fall within the range of 3 nm to 30 nm.

The ITO layer 3 is interposed between the first electrode 2 and the hole injection layer 4, and has a function of improving the bond between these layers.

The hole injection layer 4 is made from $WO_x$ (tungsten oxide) or $Mo_xW_yO_z$ (molybdenum-tungsten oxide). Note that the hole injection layer 4 only has to be made from a metal compound performing a function of injecting holes. Examples of such a metal compound are a metal oxide, a metal nitride, and a metal oxynitride.

When the hole injection layer 4 is made from a specific metal compound, it is easy to inject holes, and electrons contribute to light emission effectively in the light-emitting layer 6. Therefore, favorable luminescence property is obtained. It is desirable that the specific metal compound be a transition metal. The oxidization number of a transition metal is plural, and therefore the transition metal can have a plurality of levels. As a result, it becomes easy to inject holes, and thus drive voltage is reduced.

As shown in FIG. 4, the hole injection layer 4 extends laterally along bottom surfaces 5a and 5b of the bank 5, and has a recess 4a in an upper surface thereof. A bottom 4b of the recess 4a is lower than a level 5c of the bottom surface 5a of the bank 5. The recess 4a is made up of the bottom 4b and an inner side surface 4d continuing the bottom 4b. The depth of the recess 4a is approximately 5 nm to 30 nm. Since the hole-injection layer 4 is made from a metal oxide thin film that is thin enough as the first electrode 2, the hole-injection layer 4 has desirable transparency as described with reference to FIG. 12. An upper peripheral edge 4c of the recess is a convex portion composed of (i) a part of the upper surface of the hole injection layer 4 in which the recess is not formed 4e and (ii) the inner side surface 4d of the recess. The upper peripheral edge 4c is covered with a covering part 5d, which is a portion of the bank 5.

The upper peripheral edge 4c of the recess protrudes from the bottom 4b of the recess. Therefore, if the upper peripheral edge 4c is not covered with the covering part 5d made from an insulating material, electric field concentrates in the vicinity of the upper peripheral edge 4c of the recess, and localized flow of current occurs in the light-emitting layer 6. As a result, the uneven luminance occurs in a light-emitting surface and a life of the organic EL element is reduced due to localized deterioration of the light-emitting layer 6. In the present embodiment, however, the above-mentioned problems are prevented, because the upper peripheral edge 4c of the recess is covered with the covering part 5d made from an insulating material. Note that it is desirable that the thickness of the covering part 5d (a shortest distance between the upper peripheral edge 4c of the recess and the light-emitting layer 6) be 2 nm to 5 nm to effectively suppress the electric field concentration.

In an example of FIG. 4, the upper peripheral edge 4c of the recess has a right angle. The upper peripheral edge 4c of the recess, however, may have a plurality of angles, or may be curved. In such a case, the electrical field concentration is further suppressed.

In the present embodiment, the covering part 5d reaches the bottom 4b of the recess 4a, and a side surface of the bank 5 slopes upward from the bottom 4b of the recess to a top of the bank 5. With this structure, when the light-emitting layer 6 is formed using printing technology such as inkjet technology, ink is distributed to every corner of an area defined by the bank. As a result, formation of a void and the like is suppressed.

The bank 5 partitions the light-emitting layer 6 into subpixels. The bank 5 is made from an organic material, such as a resin, and has an insulating property. Examples of the organic material are an acrylic resin, a polyimide resin and a novolac-type phenolic resin. It is desirable that the bank 5 be resistant to organic solvent. Furthermore, the bank 5 can be subjected to an etching process, a baking process or the like. Therefore, it is desirable that the bank 5 be made from a highly resistant material so as not to be excessively deformed or degenerated by such processes.

The light-emitting layer 6 is included in a functional layer, and it is desirable that the light-emitting layer 6 is made from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 5-163488.

The electron injection layer 7 has a function of transporting, to the light-emitting layer 6, an electron injected from the second electrode 8. It is desirable that the electron injection layer 7 be made from barium, phthalocyanine, fluorine lithium, or a combination of these materials.

The second electrode 8 is made from transparent electrode material that is similar to the material of the first electrode 2, and is formed to have an appropriate film thickness (3 nm to 30 nm) in the same manner as the first electrode 2 so as to achieve desirable transparency.

The passivation layer 9 has a function of preventing the light-emitting layer 6 and so on from being exposed to moisture and air. The passivation layer 9 is made from a material such as SiN (silicon nitride) and SiON (silicon oxynitride).

(Problems of Double-Sided Element)

In the case of double-sided light-emitters, an important factor of the luminescence property of the element is that both the upper surface and the lower surface of the substrate efficiently produce light. Meanwhile, the inventors of the present disclosure have been making an effort to improve the luminescence property of the organic EL element by using a metal compound as the charge injection transport layer of the organic EL element.

However, in general, metal compounds have the property of absorbing visible light at a certain rate. Therefore, there is a problem that the light generated by the light-emitting layer is absorbed by the charge injection transport layer absorbs before being emitted to the outside, which leads to the degradation of the luminous efficiency.

There is another problem. When the peripheral edge of the recess formed in the surface of the charge injection transport layer is not covered with an insulative covering part, electric field concentrates in the vicinity of the edge of the recess, and localized flow of current might occur in the light-emitting layer. As a result, the uneven luminance occurs in a light-emitting surface and a life of the organic EL element is reduced due to localized deterioration of the light-emitting layer.

In particular, when localized light emission occurs in the light-emitting surface, it means that the light-emitting surface includes a light-emitting area and a non-light-emitting area. If the element is the double-sided light-emitter, the non-light-emitting area does not contribute to the light emission, and the non-light-emitting area in the substrate will be simply transparent. As a result, the background behind the light-emitter is seen through the substrate, and the display quality of the light-emitter or the display panel using such light-emitters will be degraded.

In view of the problems above, the present embodiment provides the following structure: in an area defined by a bank 5, a charge injection transport layer (hole injection layer 4) has a recess 4a in an upper surface thereof, and a light-emitting layer 6 is formed on the bottom of the recess 4a. By using the recess 4a which is a relatively thin part in the hole injection layer 4, the absorption rate of the light emitted from the light-emitting layer 6 when driven is reduced.

This effect will be specifically described next. For example, when a tungsten oxide layer is used as the charge injection transport layer, the optical transmittance at the wavelength of 400 nm is 95% when the film thickness of the tungsten oxide layer is 12 nm and 93% when the film thickness is 15 nm. The optical transmittance at the wavelength of 450 nm is 97% when the film thickness of the tungsten oxide is 12 nm and 95% when the film thickness is 15 nm. The optical transmittance at the wavelength of 530 nm is 98% when the film thickness of the tungsten oxide is 12 nm and 97% when the film thickness is 15 nm. In this way, even though the difference in the film thickness of the tungsten oxide is only 3 nm, the optical transmittance greatly differs. That is, the difference in the optical transmittance increases in proportion to the difference in the film thickness.

In the case of a device like an organic EL display having a multilayer structure, the optical transmittance of the device is obtained by multiplying the transmittances of the layers. Therefore, it is important to improve the optical transmittance of each layer so as to be close to 100%. In particular, in the case of blue light, which involves difficulty in development of the material, the present embodiment is effective for improving the optical transmittance and the luminous efficiency, and is therefore effective for improving the characteristics of the device in total. As described above, the recess formed in the area of the charge injection transport layer defined by the bank improves the optical transmittance of the light-emitting area, which leads to a desirable double-sided light-emitter. A desirable range of the depth of the recess 4a is approximately 5 nm to 30 nm.

Furthermore, in the present embodiment, the peripheral edge of the recess 4a formed in the hole-injection layer 4 is covered with a portion of the bank 5. This prevents localized light emission in the light-emitting surface, and realizes uniform light emission from the entirety of the desired light-emitting area. As described above, no non-light-emitting area, which does not contribute to lighting, is formed in the light-emitting surface. Therefore, light generated by the light-emitting layer is emitted outside from both the upper surface and the lower surface of the display with high luminous efficiency (as indicated by the arrows shown in FIG. 3). As a result, desirable light emission or display is realized while preventing the background behind the double-sided light-emitter from being seen through the substrate.

<Manufacturing Method>

FIGS. 5A, 5B, 5C, 6A, 6B, 6C, 7A, 7B, and 7C are each a process chart showing a method of manufacturing the organic EL display pertaining to an embodiment of the present disclosure.

Figure 5A:
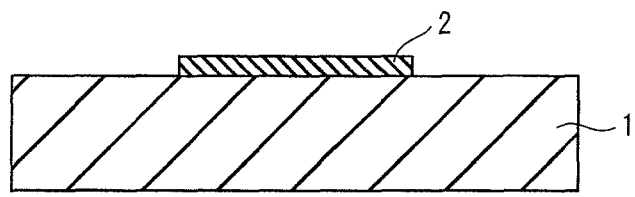
FIGS. 5A, 5B, and 5C are each a process chart showing a method of manufacturing the organic EL display pertaining to an embodiment of the present disclosure.

First, as shown in FIG. 5A, the first electrode 2 is formed on the substrate 1 by vacuum forming. As the vacuum forming, a known process may be adopted, such as a vacuum deposition method, sputtering, an electron beam method, a CVD method, or ion plating. When sputtering is selected from the methods listed above to form an Ag thin film, a sputtering apparatus is used. The sputtering apparatus utilizes a known DC magnetron sputtering method, for example. The chamber is filled with an inactive gas such as an argon gas at a predetermined pressure (e.g. $3\times10^{-1}$ Pa), and an Ag thin film is uniformly formed on the surface of the substrate 1. Subsequently, the Ag thin film is patterned by photo lithography, and thus the first electrodes 2 are formed in a matrix.

Alternatively, when a vacuum deposition method is used, resistance heating is desirable. Specifically, pellets for deposition containing a predetermined transparent electrode material, or particles of the material, are put into a resistance heating boat or a resistance heating filament of a vacuum deposition apparatus. Next, the substrate 1 is attached to a given substrate holder, the inside pressure of the chamber is reduced to $5\times10^{-4}$ Pa, the substrate is heated to approximately 10° C. to 100° C., and the film is formed at a deposition speed of no greater than 20 nm/sec. After this process, the deposited film is patterned as described above.

Figure 5B:
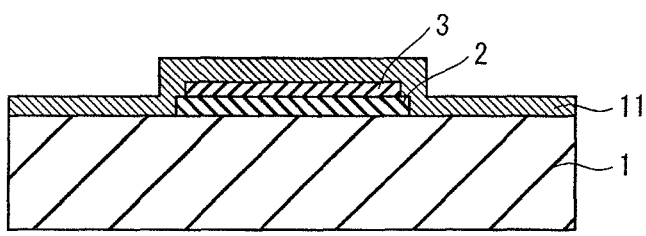

Next, as shown in FIG. 5B, a thin ITO film is formed by using similar vacuum forming as adopted for the first electrode 2 (e.g. sputtering). The formed thin ITO film is then patterned using the photolithography or the like to form the ITO layer 3.

Then, a thin film 11 of $WO_x$ or $Mo_xW_yO_z$ is formed from a composition containing $WO_x$ or $Mo_xW_yO_z$ using a similar method adopted for the first electrode 2 such as vacuum deposition and sputtering.

Figure 5C:
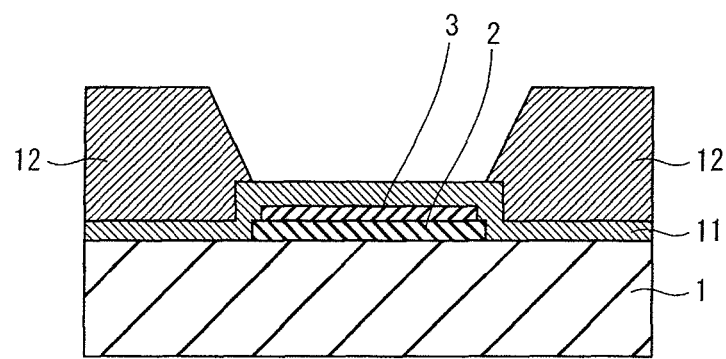

Next, as shown in FIG. 5C, a bank material layer 12 is formed on the thin film 11 by using an organic material as a bank material. A portion of the bank material layer 12 is removed so that the thin film 11 is partially exposed. The bank material layer 12 is formed by coating the thin film 11 with the bank material, for example. The portion of the bank material layer 12 can be removed by patterning using a predetermined liquid developer (such as a tetramethylammonium hydroxide (TMAH) solution).

Figure 6A:
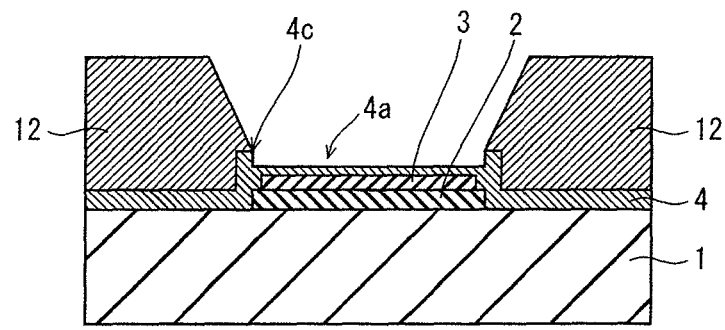
FIGS. 6A, 6B, and 6C are each a process chart showing the method of manufacturing the organic EL display pertaining to an embodiment of the present disclosure.

Here, $WO_x$ or $Mo_xW_yO_z$, which is a material for the thin film 11, is soluble in pure water or a TMAH solution. Therefore, the solution washes away the bank residue attached to the surface of the thin film 11, and an exposed portion of the thin film 11 is eroded, and a recess is formed as shown in FIG. 6A. As a result, the hole injection layer 4 having the recess 4a is formed.

Figure 6B:
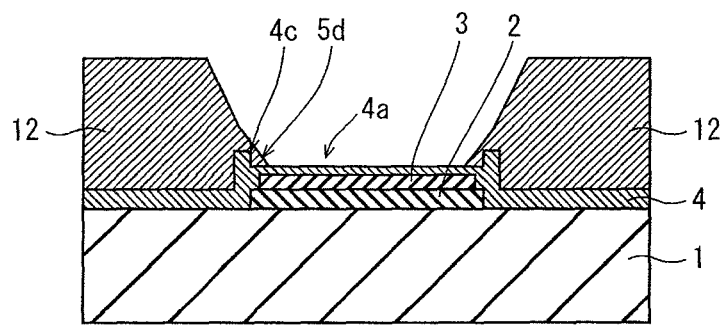

Next, as shown in FIG. 6B, the remaining portion of the bank material layer 12 is made fluid to some extent by heat treatment so that a bank material extends to cover the upper peripheral edge 4c of the recess. The upper peripheral edge 4c of the recess is covered with the covering part 5d in the above-mentioned manner. A heat cure can be adopted as the heat treatment, for example. The temperature and time for the heat cure may be appropriately determined in consideration of a type of the bank material and a required thickness of the covering part 5d and so on. After that, a surface of the remaining portion of the bank material layer 12 is, for example, subjected to treatment using fluorine plasma and the like to provide liquid repellency as necessary, and, as a result, the bank 5 is formed.

Figure 6C:
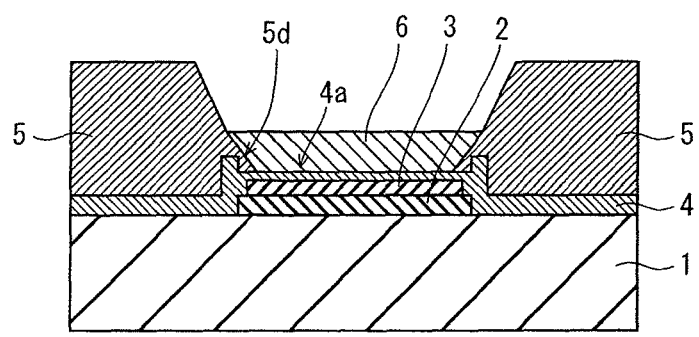

Subsequently, as shown in FIG. 6C, an ink composition including an organic EL material (hereinafter, simply referred to as "ink") is dropped in the area defined by the bank 5 by the inkjet method or the like. By drying the ink, the light-emitting layer 6 is formed. Note that the ink may be dropped by a dispenser method, a nozzle-coat method, a spin coat method, an intaglio printing, a letter press printing, or the like.

Figure 7A:
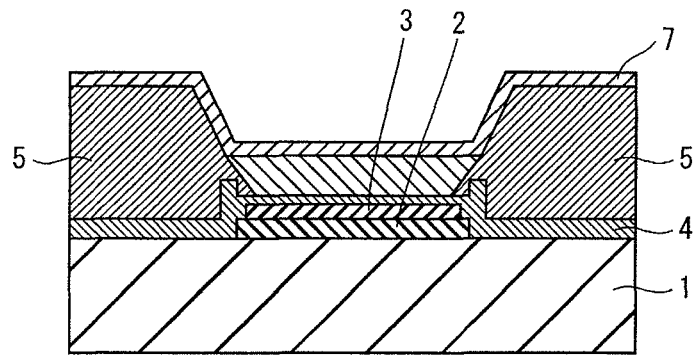
FIGS. 7A, 7B, and 7C are each a process chart showing the method of manufacturing the organic EL display pertaining to an embodiment of the present disclosure.
Figure 7B:
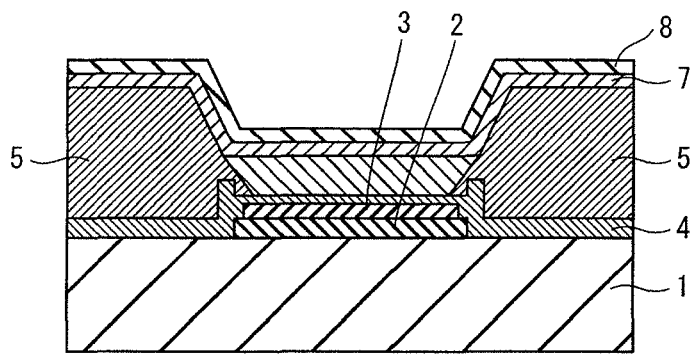

Next, as shown in FIG. 7A, a thin barium film as the electron injection layer 7 is formed by vacuum deposition for example. Then, as shown in FIG. 7B, a thin ITO film as the second electrode 8 is formed by similar vacuum forming as adopted for the first electrode 2, for example. At this point, the light-emitting layer 6 has already been formed. Therefore, considering the thermal influence and the convenience, it is desirable to form the second electrode 8 by sputtering or vacuum deposition which applies heat to the substrate 1 at a relatively low temperature. Note that the intensity of the film formation should be well controlled so that the light-emitting layer 6 will not be damaged by plasma generate in the sputtering.

Figure 7C:
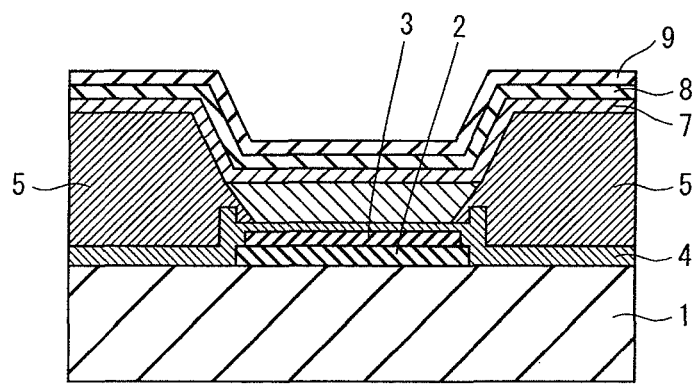

Subsequently, the passivation layer 9 is formed as shown in FIG. 7C.

With the above-described manufacturing method, even when the recess 4a is formed in an exposed portion of the hole injection layer 4 during manufacturing, the electrical field concentration in the vicinity of the upper peripheral edge 4c of the recess is suppressed because the upper peripheral edge 4c of the recess is covered with the covering part 5d and the light-emitting layer 6 is formed on the covering part 5d.

Furthermore, with the above-described manufacturing method, after a metal oxide layer (thin film 11) having a uniform thickness is formed, a portion of the surface is dissolved during the washing of the bank residue by using the liquid developer, in order to form a recess and reduces the thickness of the light-emitting area. Then, the hole-injection layer 4 is formed. In a practical film forming process, the productivity of the film can be stabilized by adjusting the film thickness after forming a thick film compared to forming a thin film from the beginning.

That is, in the case of forming a very thin film by the film forming process, it is necessary to complete the process from the beginning to the end in a relatively short period. However, such a thin film is likely to vary in terms of the thickness, the quality, etc. This is because the film formation is performed during a period before the conditions for the film forming become stable (e.g. in the case of a sputtering method, the film formation begins before the plasma generated in the chamber by discharge becomes stable), and the film formed during such a period, which has unstable characteristics, occupies a large proportion to the entire film. In contrast, according to the above-described manufacturing method, the thin film 11 having a certain thickness is formed first, and then a recess is formed in the surface by dissolving a portion of the surface. Therefore, the method is advantageous in that it is possible to efficiently form the hole injection layer 4 having an excellent charge injection transport property and whose thickness is thin in the light-emitting area.

Although having been explained based on the above embodiment, the present invention is not limited to the above embodiment. For example, the following modifications can also be implemented.

(1) In the above embodiment, $WO_x$ or $Mo_xW_yO_z$ is used as a material for the hole injection layer 4. In general, however, a metal oxide, a metal nitride, and a metal oxynitride are likely to be eroded by pure water. Therefore, even when a metal other than Mo (molybdenum) and W (tungsten) is used as a material for the hole injection layer 4, a similar effect is obtained by applying the present embodiment.

(2) In the above embodiment, the recess is formed by the hole injection layer being eroded by pure water during washing. However, an effect of suppressing the electrical field concentration in the vicinity of the upper peripheral edge of the recess is obtained even when the recess is formed in another manner, by applying the present disclosure. For example, the recess may be formed by the hole injection layer being eroded by etching solution during etching, or by the hole injection layer being eroded by a release agent during removal of the resist pattern. As described above, the present disclosure is effective in a case where the hole injection layer is made from a material that is eroded when exposed to a liquid used for forming the bank, in particular, the hole injection layer is made from a material that is eroded when exposed to a liquid used while the hole injection layer is partially exposed.

Figure 8:
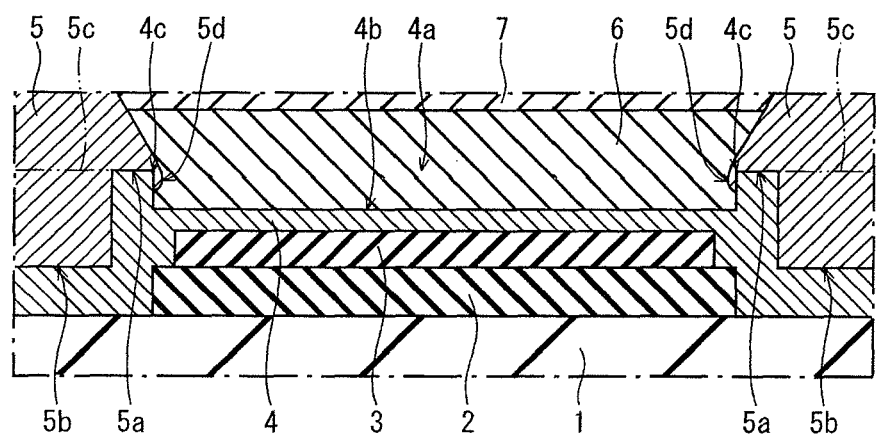
FIG. 8 is an end elevation schematically showing a cross section of a part of an organic EL display in modification of the present disclosure.

(3) In the above embodiment, the covering part extending from the bank reaches the bottom 4b of the recess beyond the upper peripheral edge 4c of the recess. However, the present disclosure is not limited to the above as long as at least the upper peripheral edge 4c of the recess is covered. For example, as shown in FIG. 8, the covering part 5d may be out of contact with the bottom 4b of the recess. When the structure shown in FIG. 8 is adopted, the temperature and time of the heat treatment are reduced, as it is not necessary to extend the bank material to the bottom of the recess.

In the above embodiment, the recess 4a is formed in the hole injection layer 4 by development in the process of forming the bank. In the present disclosure, however, mask patterning or the like may be used as a method of forming the recess.

Figure 9A:
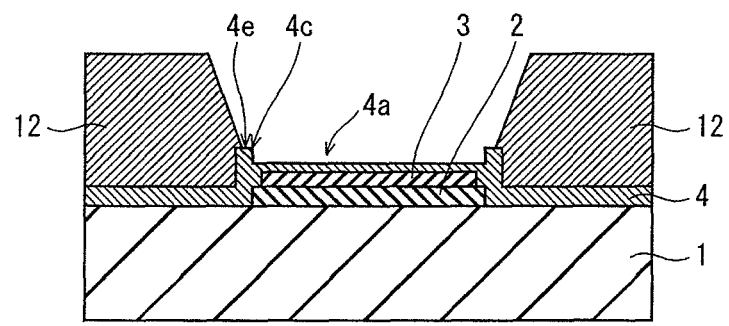
FIGS. 9A and 9B are each a process chart showing a method of manufacturing the organic EL display in modification of the present disclosure.
Figure 9B:
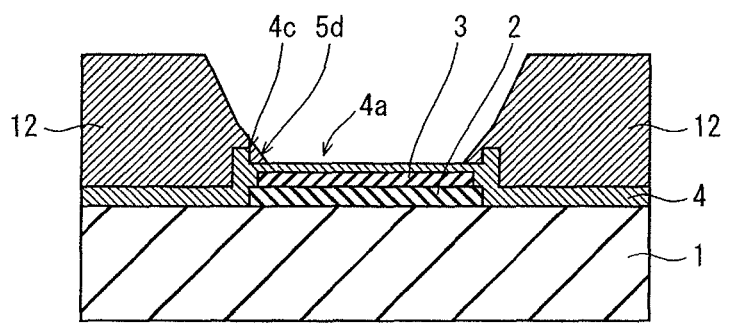

(4) In FIG. 6A, although a lower end of the slope of the bank material 12 coincides with the upper peripheral edge 4c of the recess, the structure of the bank material 12 is not limited to this. Depending on the bank material, the part of the upper surface of the hole injection layer 4 in which the recess is not formed 4e may be partially exposed by the slope of the bank material 12 being set back, as shown in FIG. 9A. In such a case, by appropriately heat treating the bank material 12, the upper peripheral edge 4c of the recess is covered with a portion of the bank material (see FIG. 9B).

Figure 10:
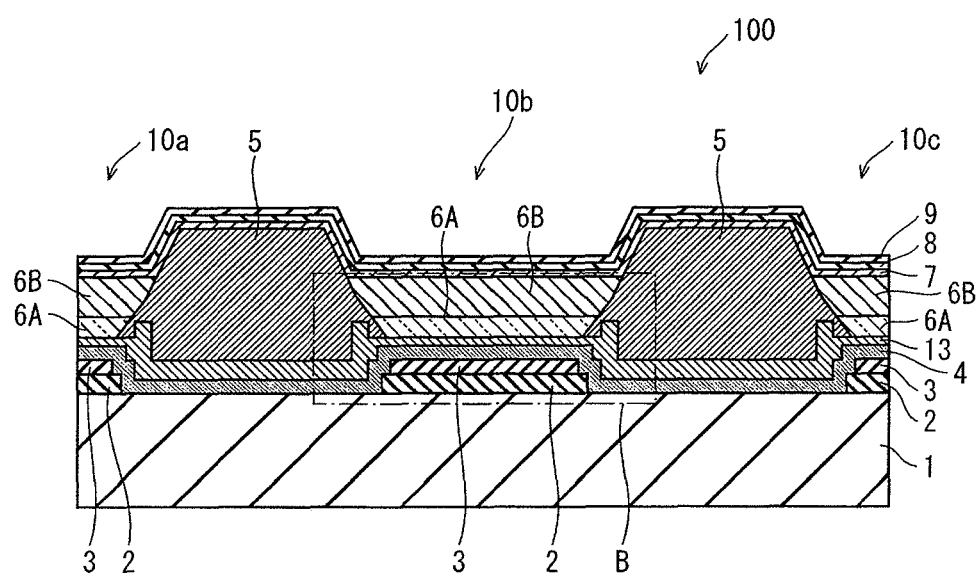
FIG. 10 is an end elevation schematically showing a cross section of a part of an organic EL display in modification of the present disclosure.

(5) In the above embodiment, as the charge injection transport layer, only the hole injection layer 4 is interposed between the first electrode and the light-emitting layer. However, the present invention is not limited to the above. For example, as shown in FIG. 10, a hole transport layer 13 may be formed on the hole injection layer 4, and these layers may be interposed as the charge injection transport layer. In this case, the recess is formed in an upper surface of the hole transport layer 13, and an upper peripheral edge of the recess formed in the hole transport layer 13 is covered with the covering part.

Figure 13:
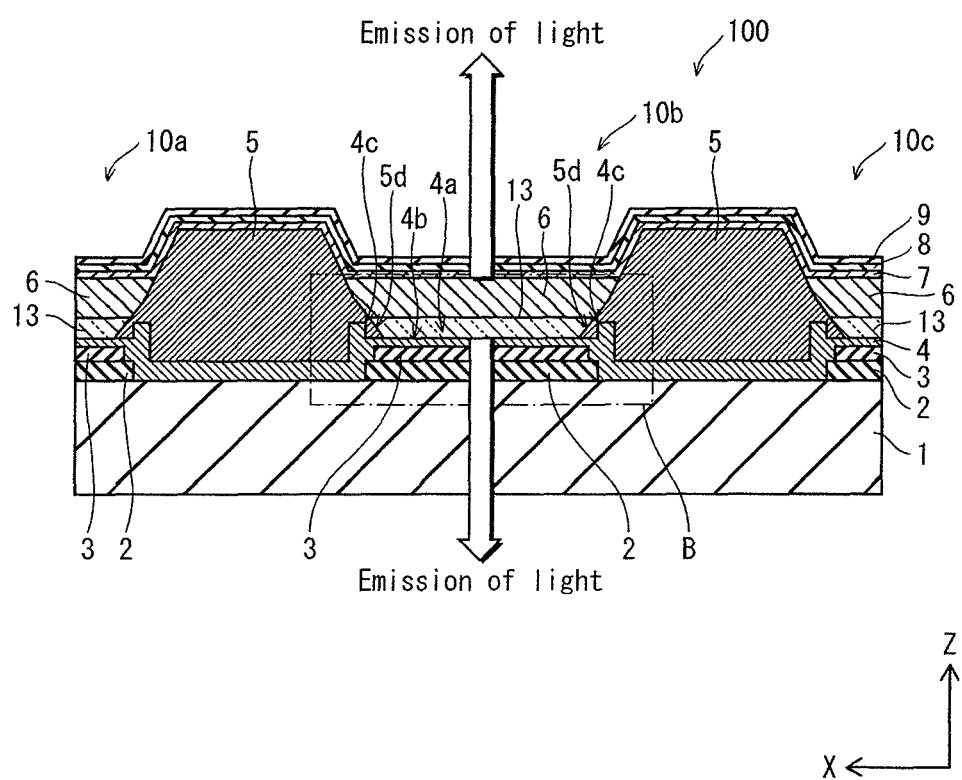
FIG. 13 is an end elevation schematically showing a part of the part of the organic EL display in modification of the present disclosure.

Furthermore, the charge injection transport layer may include only the hole injection layer, and the hole injection layer, and the hole transport layer included in the functional layer, may be interposed between the first electrode and the light-emitting layer. Specifically, in order to form the hole transport layer 13, ink containing hole transport material may be applied to the recess 4a of the hole injection layer 4 under the condition that the peripheral edge 4c of the recess 4a in the hole-injection layer 4 is covered with the covering part 5d of bank 5 as shown in the section B in FIG. 13, and in order to form the light-emitting layer 6, ink containing light-emitting material may be applied to the hole transport layer 13.

(6) In the above embodiment, since the first electrode 2 is formed from the thin Ag film, the ITO layer 3 is formed on the first electrode 2. When the first electrode 2 is formed from an Al-based material, it is possible to adopt a single layer structure of the anode without forming the ITO layer 3.

(7) In the above embodiment, although the organic EL display is taken as an example of the light-emitting device having a plurality of light-emitters, the present invention is not limited to this. The present invention may be applied to a luminaire and the like.

Figure 11:
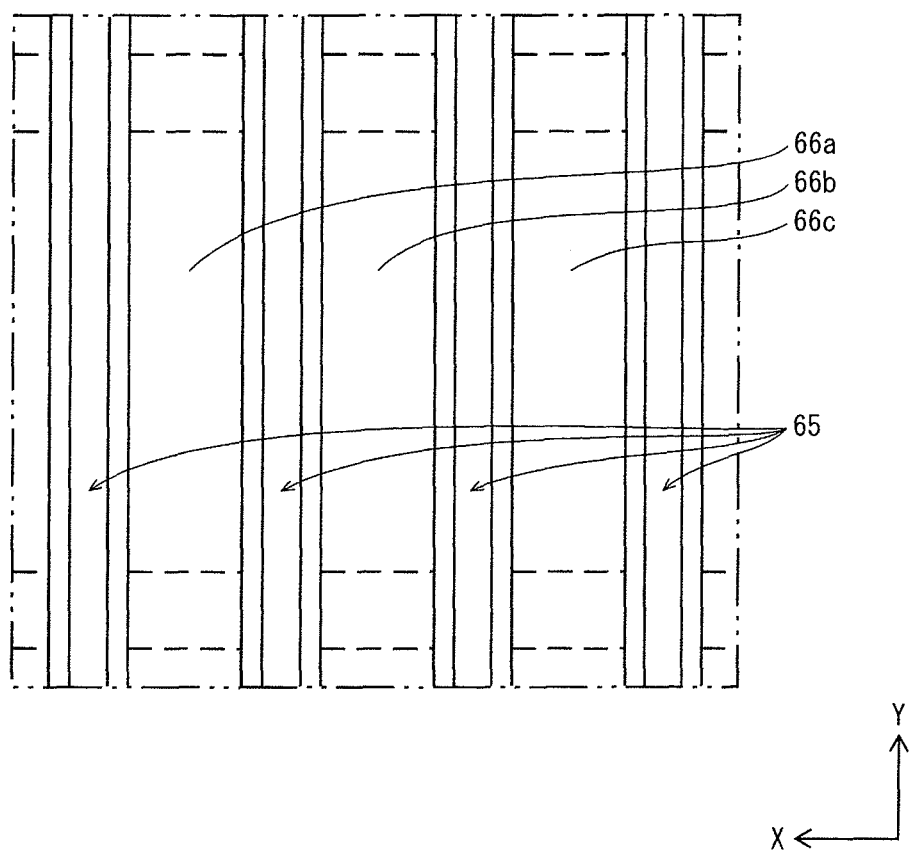
FIG. 11 is a plan view showing a part of an organic EL display in modification of the present disclosure.

(8) In the above embodiment, although the so-called pixel bank (a bank having a lattice shape) is adopted, the present invention is not limited to this. For example, a line bank (banks arranged in lines) may be adopted. In an example of FIG. 11, the line bank 65 is adopted. The line bank 65 delimits consecutive light-emitting layers 66a, 66b, and 66c arranged along the X axis. Note that when the line bank 65 is adopted as shown in FIG. 11, adjacent light-emitting layers arranged along the Y axis are not defined by the bank element. However, by appropriately determining a driving method, a size of the anode, an interval between the anodes and so on, the adjacent light-emitting layers emit light without influencing each other.

(9) In the above embodiment, although only the electron injection layer is interposed between the light-emitting layer and the second electrode, the electron transport layer may be interposed in addition to the electron injection layer.

(10) Although organic material is used as the bank material in the embodiments above, inorganic material may be used instead.

If this is the case, the bank material layer can be formed by coating with the inorganic bank material in the same manner as the case of using organic material, for example. The bank material layer can be removed by first forming a resist pattern on the bank material layer and then performing etching by using a given etchant (e.g. tetramethylammonium hydroxide (TMAH) solution). The resist pattern is removed by an aqueous or non-aqueous release agent after the etching. Next, residues remaining after the etching are removed by being washed with pure water. Here, WOx or $Mo_xW_yO_z$, which is a material for the thin film, is soluble in pure water or a TMAH solution. Therefore, an exposed portion of the thin film is eroded, and a recess is formed in the same manner as the case shown in FIG. 6A. As a result, a hole injection layer having a recess is formed. Therefore, the present disclosure is applicable to the case of using inorganic material as the bank material in the same manner as the case of using organic material.

INDUSTRIAL APPLICABILITY

The present invention is applicable to an organic EL display and the like.

REFERENCE SIGNS LIST

1 TFT substrate
2 first electrode
3 ITO layer
4 hole injection layer
4a recess
4b bottom of recess
4c upper peripheral edge of recess
4d inner side surface of recess
4e part of upper surface of hole injection layer in which recess is not formed
5 bank
5a, 5b bottom surface of bank
5c level of bottom surface of bank
5d covering part
6 light-emitting layer
7 electron injection layer
8 second electrode
9 passivation layer
10a, 10b, 10c organic EL element
11 thin film
12 bank material layer
13 hole transport layer
55 pixel bank
55a bank element
55b bank element
56a1, 56a2, 56b1, 56b2, 56c1, 56c2 light-emitting layer
65 line bank
66a, 66b, 66c light-emitting layer
100 organic EL display

The invention claimed is:

1. A double-sided light-emitter that emits light from both sides thereof, comprising:
    a first electrode;
    a laminate disposed on the first electrode that includes a charge injection transport layer and a functional layer including a light-emitting layer;
    a second electrode disposed on the laminate; and
    a bank that is insulative and defines an area in which the light-emitting layer is to be formed, wherein
    the first electrode and the second electrode are transparent electrodes,
    the charge injection transport layer has a recess in an upper surface of the area defined by the bank,
    an upper peripheral edge of the recess is covered with a portion of the bank, the upper peripheral edge of the recess comprising at least a portion of an inner side surface of the recess,
    a part of the light-emitting layer is interposed between the second electrode and the upper peripheral edge of the recess,
    the part of the light-emitting layer is interposed between the second electrode and the portion of the bank, and undergoes charge injection from the second electrode, and
    the portion of the bank is interposed between the upper peripheral edge of the recess and the part of the light-emitting layer.

2. The light-emitter of claim 1, wherein
    the charge injection transport layer is a hole injection layer made from one of a metal oxide, a metal nitride, and a metal oxynitride.

3. The light-emitter of claim 2, wherein
    the functional layer includes a hole transport layer that transports holes from the hole injection layer to the light-emitting layer, and the hole transport layer is interposed between the hole injection layer and the light-emitting layer.

4. The light-emitter of claim 1, wherein the transparent electrodes are made from ITO or IZO.

5. The light-emitter of claim 1, wherein a metal thin film that is semi-transparent or transparent is layered on at least one of the first electrode and the second electrode.

6. The light-emitter of claim 5, wherein the metal thin film contains any material selected from the group consisting of Ag, Mg, Al, Pt, Pd, Au, Ni, Ir and Cr, and has a thickness of 3 nm to 30 nm.

7. The light-emitter of claim 1, wherein the charge injection transport layer is made from a material that is eroded when exposed to a liquid used for forming the bank.

8. The light-emitter of claim 1, wherein the liquid is water or a TMAH solution.

9. The light-emitter of claim 1, wherein the portion of the bank reaches an inner bottom surface of the recess, and a side surface of the bank slopes upward from the inner bottom surface of the recess to a top surface of the bank.

10. The light-emitter of claim 1, wherein the portion of the bank is out of contact with an inner bottom surface of the recess.

11. The light-emitter of claim 1, wherein the bank includes an insulating material.

12. The light-emitter of claim 1, wherein the light-emitting layer comprises an organic EL layer.

13. The light-emitter of claim 1, wherein the charge injection transport layer extends laterally along a bottom surface of the bank.

14. The light-emitter of claim 1, wherein the upper peripheral edge of the recess comprises a convex portion composed of a part of the upper surface of the charge injection transport layer in which the recess is not formed, and the portion of the inner side surface of the recess.

15. The light-emitter of claim 1, wherein the second electrode is a cathode, the laminate includes an electron transport layer interposed between the light-emitting layer and the second electrode, and electrons injected from the second electrode are transported to the functional layer including the light-emitting layer via the electron transport layer.

16. A light-emitting device comprising a plurality of light-emitters that are each the light-emitter of claim 1.

17. A method of manufacturing a double-sided light-emitter emitting light from both sides thereof and including a first electrode, a laminate disposed on the first electrode that includes a charge injection transport layer and a functional layer including a light-emitting layer, a second electrode disposed on the laminate, and a bank that defines an area in which the light-emitting layer is to be formed, the method comprising:
    forming the first electrode from a transparent electrode;
    forming the charge injection transport layer;
    forming a bank material layer that forms the bank on the charge injection transport layer;
    removing a portion of the bank material layer to partially expose the charge injection transport layer;
    heat-treating a remaining portion of the bank material layer;
    forming the functional layer on an exposed surface of the charge injection transport layer after the heat treatment; and
    forming the second electrode from a transparent electrode, wherein
    the charge injection transport layer is made from a material that is eroded when exposed to a liquid used while the charge injection transport layer is partially exposed, the charge injection transport layer having a recess in the exposed surface thereof so that an inner bottom surface of the recess is lower than a bottom surface of a remaining portion of the bank material layer, the recess being formed by the exposed surface eroded by the liquid, the remaining portion of the bank material layer being made fluid so that the bank material layer extends to cover an upper peripheral edge of the recess, the upper peripheral edge of the recess comprising at least a portion of an inner side surface of the recess.

18. The method of claim 17, wherein the charge injection transport layer is a hole injection layer made from one of a metal oxide, a metal nitride, and a metal oxynitride.

19. The method of claim 18, wherein the functional layer includes a hole transport layer that transports holes from the hole injection layer to the light-emitting layer, and the hole transport layer is interposed between the hole injection layer and the light-emitting layer.

20. The method of claim 17, wherein the transparent electrodes are made from ITO or IZO.

21. The method of claim 17, wherein a metal thin film that is semi-transparent or transparent is layered on at least one of the first electrode and the second electrode.

22. The method of claim 21, wherein the metal thin film contains any material selected from the group consisting of Ag, Mg, Al, Pt, Pd, Au, Ni, Ir and Cr, and has a thickness falling within a range of 3 nm to 30 nm.

23. The method of claim 22, wherein the metal thin film is formed by vacuum forming.

* * * * *